United States Patent [19]

Tada et al.

[11] Patent Number: 4,938,837
[45] Date of Patent: Jul. 3, 1990

[54] CRUCIBLE RECOVERING METHOD AND APPARATUS THEREFOR

[75] Inventors: Kohji Tada; Akihisa Kawasaki, both of Osaka, Japan

[73] Assignee: Sumitomo Electric Industries, Ltd., Osaka, Japan

[21] Appl. No.: 215,822

[22] Filed: Jul. 6, 1988

Related U.S. Application Data

[63] Continuation of Ser. No. 917,521, Oct. 10, 1986, abandoned.

[30] Foreign Application Priority Data

Oct. 12, 1985 [JP] Japan .................................. 60-227260

[51] Int. Cl.$^5$ ............................................. C30B 15/12
[52] U.S. Cl. ................................. 156/608; 156/617.1; 156/618.1; 422/249
[58] Field of Search ............ 156/608, 617 H, 617 SP, 156/617 V, DIG. 83, 617.1, 620.3, 620.4

[56] References Cited

U.S. PATENT DOCUMENTS

| | | | |
|---|---|---|---|
| 3,002,824 | 10/1961 | Francis | 156/617 SP |
| 3,637,439 | 1/1972 | DeBie | 156/617 SP |
| 4,190,631 | 2/1980 | Dewees et al. | 156/608 |

FOREIGN PATENT DOCUMENTS

| | | | |
|---|---|---|---|
| 1025594 | 2/1986 | Japan | 156/617 SP |
| 1086492 | 5/1986 | Japan | 156/617 SP |
| 1261298 | 11/1986 | Japan | 422/248 |

Primary Examiner—Asok Pal
Attorney, Agent, or Firm—Cushman, Darby & Cushman

[57] ABSTRACT

A method and apparatus for recovering the inner crucible used in a double crucible process of drawing-up a single crystal. The inner crucible is recovered by pulling up the inner crucible above the molten raw material using only a simply arranged jig which does not require reconstruction of the vessel accommodating the single crystal drawing-up system. The arrangement is such that the inner crucible is allowed to rotate during the period in which the single crystal is being grown.

2 Claims, 4 Drawing Sheets

CRUCIBLE RECOVERING METHOD AND APPARATUS THEREFOR

This is a continuation of application Ser. No. 917,521, filed 10/10/86 now abandoned.

BACKGROUND OF THE INVENTION

The present invention relates, in general, to an arrangement (method and apparatus) for drawing up a single crystal using a double crucible and, in particular, to crucible recovery.

The single crystal referred to herein includes Groups III-V semiconductor single crystals of GaAs, InP, GaP, etc.; Groups II-VI single crystals of ZnSe, ZnS; CdTe, etc.; and semiconductor single crystals and oxide crystals of Si, Ge, etc.

The single crystal drawing-up process includes the Czochralski process (CZ process), a liquid capsule process (LEC process), etc.

The process of drawing-up a single crystal using double crucibles (hereinafter, referred to as a double-crucible process) is used for uniformly doping impurities. In the double-crucible process, an inner crucible is put in an outer crucible so that there is communication between the inner crucible and the outer crucible through a thin through hole in the inner crucible. A single crystal is drawn up out of molten raw material in the inner crucible.

Generally, a coefficient of impurity segregation in molten raw material is not 1, and, therefore, the concentration of impurity in the molten material varies as a single crystal grows therein. The double-crucible process is effective in preventing this variation. If the impurity concentration in the inner crucible is set to be 1/k of that in the outer crucible, where k represents the coefficient of impurity segregation, it is possible to greatly reduce the variation in impurity concentration.

It is important to recover a crucible for the purpose of reuse because a crucible is expensive. PBN crucibles are generally recovered and reused, while quartz crucibles are frequently used and then discarded.

In order to recover a crucible, it is necessary to remove solid matter raw material remaining in the crucible. Solid raw material per se may be easily removed. When a liquid sealing agent such as $B_2O_3$ or the like is used, however, it becomes difficult to remove the solid matter because the sealing agent also solidified.

Even in a single-crucible process, it is difficult to remove solidified matter that is composed both of solidified raw material and of solidified sealing agent. To remove the solidified matter, a suitable agent is poured into the crucible to dissolve the surface of the solidified matter so as to form a gap between the crucible and the solid matter. The crucible is then bent so as to separate the solidified matter therefrom.

It is more difficult to remove solidified matter in a double-crucible process because the inner crucible is fixed in solidified raw material and solidified sealing agent. The remaining solidified matter adheres to both the inner and outer surfaces of the double crucible. A method has been proposed for recovering the inner crucible wherein the inner crucible is removed from the outer crucible and hung up after the single crystal has finished growing and while the raw material is still in a molten state.

An inner crucible hanging-up apparatus such as that described above has been disclosed, for example, in European Patent Unexamined Publication No. 124,938 (laid open Nov. 14, 1984). FIG. 8 shows the conventional baffle plate type double-crucible hanging-up apparatus as disclosed in that publication. In the drawing, inner crucible 31 is connected to up/down driving rod 27 through hangers 25, up/down driving rod 27 being a separately provided up/down movable member for making it possible to cause inner crucible 31 to move vertically.

After growth of the single crystal has been completed, the single crystal is drawn up and the output of the heater is gradually reduced. At this time, molten raw material and molten sealing agent remain in the inner and outer crucibles. While the raw material and the sealing agent are in their molten states, up/down driving rod 27 is pulled up thereby taking inner crucible 31 out of the molten materials which molten materials include the molten raw material and the molten sealing agent. The temperature in the vessel accommodating the crucibles is gradually decreased with inner crucible 31 maintained in the state separated from the molten materials, so that the molten materials are solidified in the outer crucible. Thus, it is easy to recover the inner crucible because the molten materials have been excluded therefrom.

In this prior art it is not intended to recover the inner crucible but to move the inner crucible down corresponding to the descent of the surface of the molten materials as detected by sensor 29. It is easy to keep the impurity concentration in the molten materials constant because the level of molten materials in the inner crucible can be kept constant.

In the arrangement described above, it may be possible to keep the inner crucible in the state drawn up out of the raw material. This is no more than presumption on the part of the Applicant, however, since the foregoing European Patent Unexamined Publication does not describe this matter.

It is difficult to add such an up/down movement device to a single crystal drawing-up apparatus which device moves only the inner crucible up and down. The arrangement of a single drawing-up apparatus becomes complicated if an inner crucible up/down moving device is added because the whole apparatus is accommodated in a pressure-resistant vessel which vessel can be evacuated and pressurized.

In the case of a single crystal drawing-up apparatus for preparing a single crystal of a compound semiconductor, it is particularly difficult to add an inner crucible up/down moving device as described above because the entire apparatus is accommodated in a high-temperature and high-pressure vessel. There is an additional disadvantage in that it is impossible to rotate the inner crucible if it is connected to inner crucible hanging wires. Generally in a single crystal drawing-up apparatus, the single crystal and crucible are rotated independently from each other, and the diameter of the single crystal is controlled by controlling the respective rotational speed. Therefore, it is impossible to expect stable growth of the single crystal if the inner crucible cannot be rotated.

SUMMARY OF THE INVENTION

An object of the present invention is to provide an inner crucible recovering method and apparatus therefor, in which the inner crucible is recovered by pulling up the inner crucible above the molten raw material using only an simply arranged jig and without reconstructing the vessel accommodating the a single crystal drawing-up system.

Another object of the present invention is to provide an inner crucible recovering method and an apparatus therefor, in which the inner crucible is allowed to rotate during the period in which the single crystal is being grown, thereby making possible the stable growth of the single crystal.

In the inner crucible recovering apparatus according to the present invention, the relative displacement between the heat insulator attached to the apparatus and a lower shaft is utilized to remove the inner crucible from molten raw material. To this end, a cylindrical stopper member provided with upper and lower stoppers is mounted on the heat insulator.

The inner crucible is connected to rod-like inner crucible recovering jigs each extending upward and each having a bent portion projected horizontally outward. Recessed and projecting portions are formed in the inner periphery of the upper stopper. The bent portion of each of the inner crucible recovering jigs is arranged so that it is allowed to pass freely through the recessed portion but is caught by the edge of the projecting portion to prevent the passage therethrough. The bent portion is also caught by the lower stopper.

If the inner crucible is rotated slightly, the bent portions connected to the inner crucible can be pushed down by the upper stopper because the positional relationship between the bent portions and the recessed and projecting portions of the upper stopper is changed. The bent portions can be pulled up by the lower stopper. This movement is utilized to hang up the inner crucible out of the molten raw material before the raw material solidifies.

DETAILED DESCRIPTION OF THE PREFERRED EMBODIMENT

Referring to the accompanying drawings, an inner crucible recovering method and an apparatus therefor according to the present invention are be described hereunder.

Figure 1:
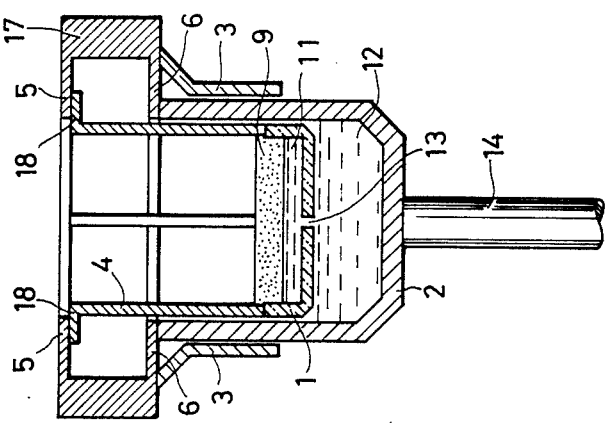
FIG. 1 is a longitudinal cross section showing a single crystal drawing-up system provided with a crucible recovering apparatus according to the present invention after the raw material is charged.

FIG. 1 is a longitudinal cross section showing only the area of a double-crucible which is part of a single crystal drawing-up system which system is provided with the inner crucible recovering apparatus according to the present invention, in the state immediately after raw material has been set.

In the drawing, inner crucible 1 is put in outer crucible 2, and heat insulator 3 is attached in the vicinity of the upper edge of the outer peripheral surface of outer crucible 2. Heat insulator 3 is attached to the apparatus in a manner similar to a heater (not shown) but heater insulation 3 is not connected to the outer crucible 2.

Inner crucible 1 is provided with two or more inner crucible recovering jigs 4 connected thereto and extending vertically upward therefrom, an upper end of each of the inner crucible recovering jigs 4 being projected horizontally outward to form a bent portion 18.

Stopper member 17 provided with upper and lower stoppers 5 and 6, respectively, is mounted on heat insulator 3. Stopper member 17 may be attached to or merely placed on heat insulator 3.

When raw material is set, the inside of outer crucible 2 is filled with solid sealing agent 7, such as $B_2O_3$, and solid polycrystal (or single crystal) raw material 8.

Figure 5:
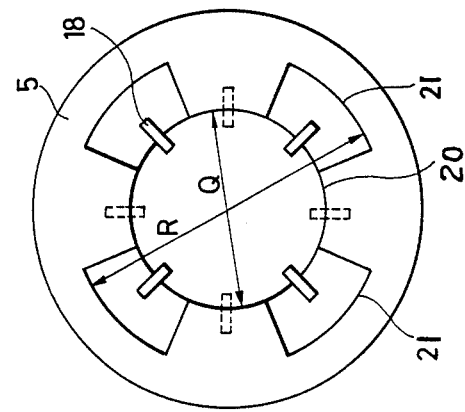
FIG. 5 is a plan view showing the upper stopper of the stopper member.

FIG. 5 is a plan view showing upper stopper 5 which is annularly shaped and provided with projecting portion 20 and recessed portion 21 in its inner periphery. It is preferable to make the number of axes of symmetry of projecting portions 20 and recessed portions 21 equal to that of bent portions 18 of inner crucible recovering jigs 4. However, the former may be set to be an integer times as large as the latter. For example, assuming that there are m bent portions with m symmetry axes, the projecting and recessed portions may be set to have m symmetry axes, 2m symmetry axes, 3m symmetry axes, etc. In the illustrated embodiment, both bent portions 18 and upper stoppers 5 are set to have four symmetry axes. Letting the maximum outer diameter of jigs 4 (the distance between the respective extremities of two symmetrically opposite bent portions 18) be represented by P, the inner diameter of upper stopper 5 at two symmetrically opposite projecting portions 20 be represented by Q, the inner diameter of the stopper 5 at two symmetrically opposite recessed portions 21 be represented by R, and the inner diameter of the lower stopper 6 be represented by S, the following relationships are established:

$$Q < P < R \quad (1)$$

$$S < P \quad (2)$$

Thus, bent portions 18 are allowed to pass through upper stopper 5 at recessed portions 21, but are not allowed to pass through upper stopper 5 at projecting portions 20 because of being caught by the edges of projecting portions 20. Bent portions 18 are also not allowed to pass through lower stopper 6.

In this embodiment, heat insulator 3 is attached to the pressure-resistant vessel in the vicinity of the outer periphery of outer crucible 2. Stopper member 17 is held by heat insulator 3. This arrangement is possible because of the coincidental presence of heat insulator 3. Stopper member 17 may be attached to the pressure-resistant vessel at any other position by any other means if heat insulator 3 is not in the position described above.

Figure 3:
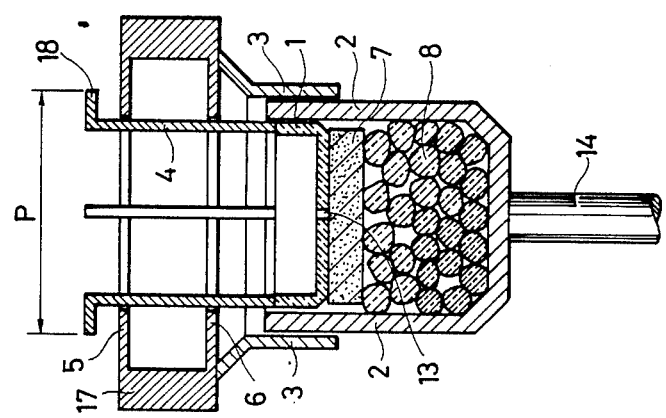
FIG. 3 is a longitudinal cross section showing the same single crystal drawing-up system when the inner crucible is pushed into the molten raw material.

Upper stopper 5 is provided for pushing inner crucible 1 into molten raw material 10 as shown in FIG. 3. If the foregoing operation of upper stopper 5 can be omitted, upper stopper 5 becomes unnecessary. Whether the operation can be omitted depends on the diameter and number of through holes present in inner crucible 1.

In the inner crucible recovering apparatus according to the present invention, the most important point is that after the growth of single crystal has been completed, inner crucible 1 is hung up by being caught by lower stopper 6. In the raw material setting step shown in FIG. 1, bent portions 18 of inner crucible recovering jigs 4 are projected from upper stopper 5.

Figure 2:
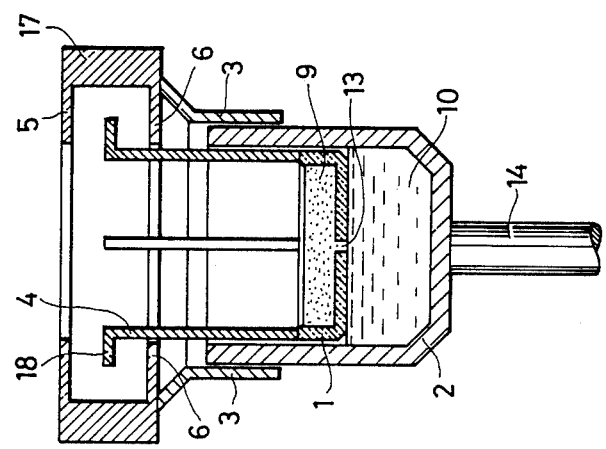
FIG. 2 is a longitudinal cross section showing the same single crystal drawing-up system after the raw material is molten.

FIG. 2 shows the state where the heater is energized to thereby increase the temperature in the crucibles in order to melt the raw material and the sealing agent. The sealing agent is first melted to form of molten sealing agent 9, and then the raw material is melted to form molten raw material 10. Molten raw material 10 then enters inner crucible 1, from outer crucible 2 through narrow through hole 13 formed in the bottom of inner crucible 1. As a result, inner crucible 1 moves down together with inner crucible recovering jigs 4, so that bent portions 18 of inner crucible recovering jigs 4 pass through recessed portions 21 of upper stopper 5 to an intermediate position between upper and lower stoppers 5 and 6, respectively.

As shown in FIG. 2, molten raw material 10 barely enters inner crucible 1 through the through hole 13. This is because of the high viscosity and large surface tension of molten raw material 10. In addition, inner crucible 1 may be pushed up by bubbles generated in molten raw material 10.

Molten raw material 10 is caused to enter inner crucible 1 by moving lower shaft 14 up. Although inner crucible 1 is pushed up by molten raw material 10, further upward movement of crucible 1 is prevented by upper stopper 5. As shown in FIG. 3, this occurs when the bent portions 18 reach upper stopper 5 because bent portions 18 abut projecting portions 20 of upper stopper 5. In FIG. 5, bent portions 18 in the position shown in FIG. 3 are indicated by broken lines.

Outer crucible 2 is moved up relative to inner crucible 1, which is now prevented from moving up, so that inner crucible 1 is pushed into molten raw material 10. This is shown in FIG. 3 in longitudinal cross-section. Thus, inner crucible 1 is forced into molten raw material 10, so that molten raw material 10 enters inner crucible 1 through the through hole 13. Molten raw material 10 is thus divided into two parts, that is, inner-crucible-inside molten raw material 11 and an outer-crucible-inside molten raw material 12.

The next step in the process is the growth of a single crystal. Upper shaft 19, shown in FIG. 4, having seed crystal 15 attached at its lower end is moved down to soak seed crystal 15 in inner-crucible-inside molten raw material 11. Upper shaft 19 is then slowly pulled-up while being rotated, so that single crystal 16 is pulled up following seed crystal 15.

Figure 6:
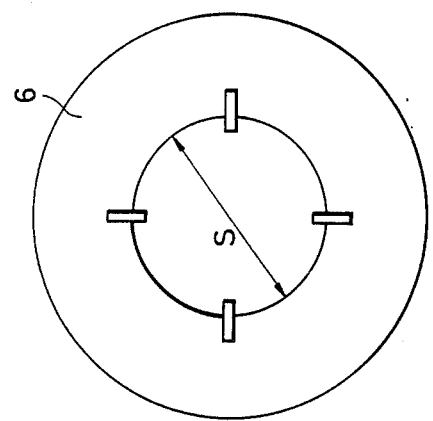
FIG. 6 is a plan view showing the lower stopper of the stopper member.

Although the growth of single crystal 16 is not shown, during this step inner-crucible-inside molten raw material 11 decreases gradually, so that the surface of inner-crucible-inside molten raw material 11 is falling and, therefore, inner crucible 1 is moving down. Bent portions 18 come off of upper stopper 5 and also gradually move down. After growth of single crystal 16 has been completed, single crystal 16 is pulled up out of inner-crucible-inside molten raw material 11. Lower shaft 14 is then moved down. At this time, bent portions 18 of inner crucible recovering jigs 4 abut lower stopper 6. This state is shown in plan in FIG. 6. Bent portions 18 necessarily abut lower stopper 6 because diameter P at bent portions 18 is set to be larger than inner diameter S of lower stopper 6.

When inner crucible 1 is hung up, the remaining inner-crucible-inside molten raw material 11 and molten sealing agent 9 drain into outer crucible 2 through the through hole 13. Thus, no molten materials remain in inner crucible 1. While in this position, the output of the heater is gradually reduced so as to cool inner and outer crucibles 1 and 2, respectively, single crystal 16, etc.

In outer crucible 2, remaining molten raw material 10 is first solidified and then remaining molten sealing agent 9 is solidified. This cooling step is continued until the temperature in the vessel reaches approximately room temperature.

After the cooling has been completed, the pressure-resistant vessel (not shown) which accommodates the single crystal drawing-up system is opened and single crystal 16, and inner and outer crucibles 1 and 2, respectively, are removed.

It is possible to make inner crucible 1 reusable by a simple treatment because only small quantities of molten materials are solidified on the outer and inner surfaces of inner crucible 1. A small quantity of solidified raw materials remaining on inner crucible 1 can be removed, for example, by washing with warm water or by etching with chemicals.

Inner crucible recovering jigs 4 extending vertically upward from inner crucible 1 do not touch molten raw material 10 when the raw material is set in a manner such as shown in FIG. 1. Therefore, inner crucible recovering jigs 4 need not be resistant to corrosion caused by molten raw material 10.

If inner crucible recovering jigs 4 are made of a material resistant to corrosion caused by molten raw material 10 and resistant to the temperature of molten raw material 10, then inner crucible recovering jigs 4 may be arranged so as to come into contact with molten raw material 10. Specifically, inner crucible recovering jigs 4 may be made of, for example, BN, PBN, or AlN, or may be made of a heat-resistant metal material coated with the foregoing materials. This being the case, it is possible to partially or entirely charge the solid raw material as well as the solid sealing agent in inner crucible 1. When the quantity of charge in inner crucible 1 is sufficiently large, the step (shown in FIG. 3) in which inner crucible 1 is pushed into the molten materials can be omitted.

EXAMPLE

A single crystal of Si-doped GaAs was pulled up using a polycrystal of GaAs as a raw material and $B_2O_3$ as a liquid sealing agent. An outer crucible of PBN having an inner diameter of six inches and an inner crucible of PBN having an inner diameter of four inches were used.

Five thousand grams of GaAs polycrystal and 700 g of $B_2O_3$ were charged in outer crucible 2, and inner crucible 1 was put on the thus charged materials.

A vessel in which inner and outer crucibles 1 and 2, respectively, were accommodated was closed. In a nitrogen atmosphere, a heater was energized so as to gradually increase the temperature of the crucibles. When the raw material and sealing agent were molten as shown in FIG. 2, inner crucible 1 was pushed into molten raw material 10 because bent portions 18 were prevented from rising by upper stopper 5 as shown in FIG. 3. As a result, 900 g of molten GaAs entered inner crucible 1 through the through hole 13.

Figure 4:
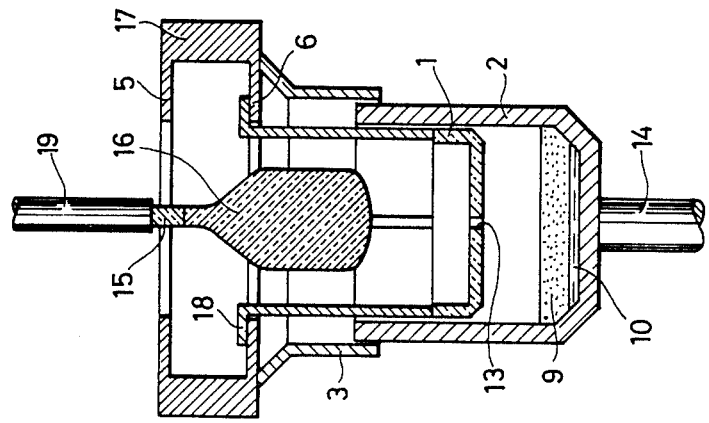
FIG. 4 is a longitudinal cross section showing the same crystal drawing-up system after a single crystal has been taken out and the inner crucible has been hung up out of the molten raw material.

Molten raw material 10 was divided into inner-crucible-inside molten raw material 11 and an outer-crucible-inside molten raw material 12. Inner crucible 1 was floated in molten raw material 10 due to the equilibrium between the buoyancy and the weight of inner crucible 1. In this state, 0.25 g of Si was added to inner-crucible-inside molten raw material 11. Next, upper shaft 19 was moved down thereby soaking seed crystal 15 in inner-crucible-inside molten raw material 11 in order to grow single crystal 16. Single crystal 16 thus grown, having a diameter of 60 mm and a length of about 300 mm, was drawn up. As shown in FIG. 4, lower shaft 14 was moved down thereby hanging inner crucible 1 above molten raw material 10. The output of the heater was then reduced to gradually cool the entire vessel.

After cooling, the vessel was opened and single crystal 16 and inner and outer crucibles 1 and 2, respectively, were removed from the vessel. Inner crucible 1 could be easily cleaned by washing with water or etching with chemicals.

Thus, it is possible to reuse expensive inner crucible 1 ten or more times thereby greatly reducing the cost required for growing single crystals.

Figure 7:
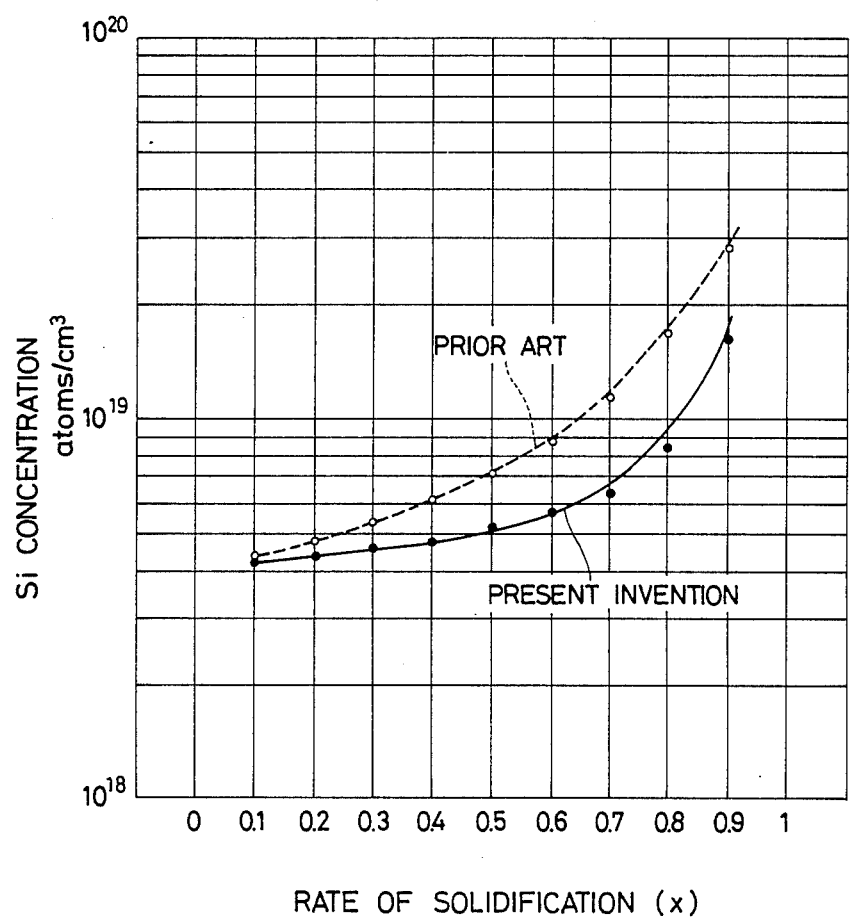
FIG. 7 is a graph showing the Si concentration of single crystals of Si-doped GaAs pulled up in the double-crucible system according to the present invention and the conventional single-crucible system. The abscissa and the ordinate represent the rate of solidification and the Si concentration (atoms/cm$^3$), respectively.
Figure 8:
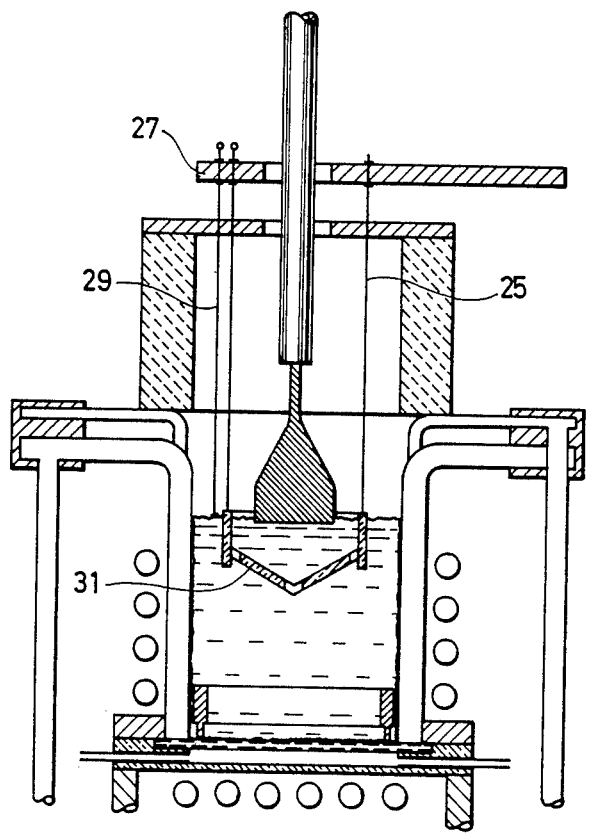
FIG. 8 is a longitudinal cross section showing the double-crucible single crystal drawing-up system as disclosed in the foregoing European Patent Unexamined Publication No. 124,983.

The Si concentrations in single crystals drawn up in the double-crucible system according to the present invention and in the conventional single-crucible system were measured. The results are shown in FIG. 7. The abscissa represents the rate of solidification (X). The rate of solidification is the quotient obtained by dividing the weight from an extremity of the seed crystal to a certain position in the single crystal by the quantity of initially charged raw material, and correlates with the distance from the extremity of the seed crystal.

As shown in FIG. 7, in the initial stage, the Si concentration the case of the double-crucible system was equal to that obtained in the case of the conventional single-crucible system. Using the conventional method, however, the Si concentration increased rapidly. The value of X was 0.5 when the Si concentration reached $7 \times 10^{18}/cm^3$. Using the double-crucible system according to the present invention, however, the Si concentration increased slowly. The value of X was about 0.7 when the Si concentration reached $7 \times 10^{18}/cm^3$. If a crystal having the Si concentration lower than the value described above can be used, the yield of single crystals is greatly improved.

The following result from the use of the present invention:

(1) The difficulty in recovering the inner crucible has been a disadvantage of the conventional double-crucible method. According to the present invention, the molten raw material is solidified after the inner crucible has been hung up out of the molten material, thus making it possible to easily recover the inner crucible. The cost of producing single crystals can be greatly reduced by reusing the expensive inner crucible.

(2) According to the present invention, it is unnecessary to provide an up/down driving device for vertically moving only the inner crucible, unlike the double-crucible system disclosed in the foregoing European Patent Unexamined Publication No. 124,938. It is possible to hang up the inner crucible by the relative movement of the stopper member and the lower shaft. Furthermore, the lack of a complicated up/down driving device simplifies the arrangement of the double-crucible system.

(3) When a single crystal is drawn up, the inner crucible is not prevented from rotating, therefore, the control of the diameter of the single crystal is not lost.

What is claimed is:

1. In a single crystal drawing-up process carried out in a pressure resistant vessel, in which process a double crucible system is used consisting of an outer and an inner crucible into which crucibles is put a molten raw material or a molten raw material together with a sealing agent, said molten raw material in said inner crucible being in communication with said molten raw material in said outer crucible through a through hole in said inner crucible, and in which double crucible system a seed crystal is soaked into said molten raw material in said inner crucible, which inner crucible is free to move relative to said outer crucible during the period in which the single crystal is being grown, and then pulled up thereby drawing up a single crystal using a means for drawing-up said single crystal, a method of recovering a crucible comprising the steps of:
  (a) preparing two or more inner crucible recovering jigs and attaching said jigs to said inner crucible at its upper end portion, said recovering jigs extending vertically upward from said inner crucible, each of said inner crucible recovering jigs having a bent portion at its upper end, said bent portion projecting horizontally outward;
  (b) preparing a lower stopper and mounting said lower stopper on said pressure resistant vessel, said lower stopper having an inner diameter smaller than an outer diameter of said inner crucible recovering jigs, said outer diameter being the distance between respective extremities of opposite bent portions of said jigs, whereby said bent portions of said inner crucible recovering jigs are prevented from coming down from said lower stopper; and
  (c) providing a ring-shaped upper stopper attached at a position above said lower stopper, said upper stopper having projecting portions and recessed portions alternately formed at an inner periphery of said upper stopper, said upper stopper having a first inner diameter at said projecting portions which is smaller than said outer diameter of said bent portions of said jigs, and said upper stopper having a second inner diameter at said recessed portions, said second inner diameter being larger than said diameter of said bent portions, whereby said upper stopper allows said bent portions of said jigs to pass through said upper stopper at said recessed portions of said second inner diameter but said upper stopper preventing said bent portions of said jigs from moving up at said projecting portions of said first inner diameter;
  (d) moving said outer crucible up after said material has been molten and before said single crystal is drawn up so that said bent portions of said inner crucible recovering jigs abut said projecting portions of said upper stopper so that said inner crucible is pushed into said molten raw material in said outer crucible; and (e) moving down a lower shaft attached to said outer crucible so that said outer crucible is moved down after drawing-up said single crystal has been completed, said lower stopper preventing said bent portions of said jigs from coming down so that said inner crucible is hung up out of said molten raw material and said sealing agent, or said molten raw material.

2. The crucible recovering method according to claim 1 wherein said lower stopper is mounted on a heat insulator attached to the pressure resistant vessel in the vicinity of the outer periphery of said outer crucible.

* * * * *